(12) United States Patent
Funaki et al.

(10) Patent No.: US 7,851,124 B2
(45) Date of Patent: Dec. 14, 2010

(54) COMPOSITION FOR FORMING WIRING PROTECTIVE FILM AND USES THEREOF

(75) Inventors: Katsuhiko Funaki, Sodegaura (JP); Shuji Tahara, Sodegaura (JP); Kazuhito Fujita, Sodegaura (JP); Takeshi Tsuda, Sodegaura (JP); Etsuo Ohkawado, Sodegaura (JP)

(73) Assignee: Mitsui Chemicals, Inc., Minato-Ku, Tokyo (JP)

( * ) Notice: Subject to any disclaimer, the term of this patent is extended or adjusted under 35 U.S.C. 154(b) by 311 days.

(21) Appl. No.: 11/068,890

(22) Filed: Mar. 2, 2005

(65) Prior Publication Data
US 2005/0170270 A1   Aug. 4, 2005

Related U.S. Application Data

(63) Continuation-in-part of application No. 10/857,497, filed on Jun. 1, 2004, now abandoned.

(30) Foreign Application Priority Data

Jun. 3, 2003  (JP)  ............................. 2003-157497
Jun. 9, 2003  (JP)  ............................. 2003-163330
Jun. 9, 2003  (JP)  ............................. 2003-163331

(51) Int. Cl.
*G03F 7/028*  (2006.01)
*G03F 7/095*  (2006.01)
*G03F 7/09*  (2006.01)

(52) U.S. Cl. ............. 430/270.1; 430/281.1; 430/285.1; 430/271.1; 430/905; 430/916

(58) Field of Classification Search ........................ None
See application file for complete search history.

(56) References Cited

U.S. PATENT DOCUMENTS

| 4,421,841 | A | * | 12/1983 | Shimizu et al. | .......... 430/285.1 |
| 2002/0182536 | A1 | * | 12/2002 | Kamada et al. | .......... 430/270.1 |

FOREIGN PATENT DOCUMENTS

| JP | 11-052569 | A | | 2/1999 |
| JP | 11-052570 | A | | 2/1999 |
| JP | 11-130858 | | * | 5/1999 |
| JP | 2002-241468 | | * | 8/2002 |
| JP | 2002-278065 | A | | 9/2002 |
| JP | 2004-269622 | | * | 9/2004 |

OTHER PUBLICATIONS

JPO English abstract for JP 2002-241468 (Koyanagi et al).*
JPO English abstract for JP 2004-269622 (Kodama).*
JPO Engish abstract for JP11-130858.*
Machine-assisted English translation of JP11-130858 as provided by JPO.*
English Abstract of Japanese Patent Publication No. 10-289432, published Oct. 27, 1998.
English Abstract of Japanese Patent Publication No. 11-286082, published Oct. 19, 1999.

* cited by examiner

*Primary Examiner*—Sin J. Lee
(74) *Attorney, Agent, or Firm*—Buchanan Ingersoll & Rooney PC

(57) ABSTRACT

A composition for forming a film for protecting wiring which in one aspect includes a polyimide precursor, a compound having at least two photopolymerizable groups, and a photopolymerization initiator, wherein the polyimide precursor includes a polyimide precursor obtained from a diamine component comprising a defined diamine compound. In other aspects, a dry film for forming a wiring-protecting film using the composition and a substrate having wiring protected by means of the dry film are provided.

15 Claims, No Drawings

COMPOSITION FOR FORMING WIRING PROTECTIVE FILM AND USES THEREOF

CROSS-REFERENCE TO RELATED APPLICATIONS

This application is a continuation-in-part of application Ser. No. 10/857,497 filed on Jun. 1, 2004.

BACKGROUND OF THE INVENTION

1. Field of the Invention

The present invention relates to a composition for forming a film for protecting wiring made of Cu or the like and formed on a printed wiring board, in particular, a suspension substrate for hard discs. The present invention also relates to a dry film for forming a wiring-protecting film, using the composition, and a substrate having wiring protected by means of the dry film.

2. Description of Related Art

In order to record or reproduce information in a hard disc device used as a memory device of a computer or the like, a magnetic head is relatively traveled on a magnetic disc inside the device. The magnetic head and the magnetic disc are designed to keep a very small, constant interval therebetween against air flow generated by the traveling. A magnetic head supporting device for pressing the magnetic head onto the magnetic disc elastically against the air flow in this way is a suspension. In recent years, as the suspension, there has been used a member wherein a circuit is formed directly on a stainless steel plate, several ten micrometers in thickness, having spring performance. In the step of fabricating a hard disc, such a suspension is set on a magnetic disc. This is performed using a special tool, a robot arm, or the like. At this time, it is feared that gold plating on wiring laid on the suspension substrate is injured. In order to remove this fear, a wiring-protecting layer for protecting the wiring portions is usually laid. Hitherto, liquid photosensitive polyimide has mainly been used in this wiring-protecting layer of the suspension. This material is chiefly applied by spin coating, and then dried, exposed to light, developed and cured, thereby forming a protecting layer. However, it is difficult to perform the spin coating after wiring is formed on the suspension substrate or the external form of the suspension substrate is worked. It is also difficult to collect and recycle the solution which has not been used to form the film. As described herein, the spin coating has various problems. The photosensitive polyimide also has problems that: the polyimide is not easily made into a thick film since the polyimide has a poor light transmissivity; development using an organic solvent is required and the working environment for the development is undesirable; and a great amount of environment polluting material is discharged. In order to solve these problems, a protecting film material in a dry film form is suggested in Japanese Patent Application Laid-Open (JP-A) No. 10-289432. In this method, however, it is unavoidable to carry out development using a high-concentration alkali solution in water. Moreover, when this protecting film material is used in a thin suspension substrate, the suspension substrate receives shrinkage stress at the time of the formation of a protecting film, so as to warp up. Consequently, a problem that inconvenience is caused at the time of other workings is encountered.

In recent years, the following has become a problem: when parts such as semiconductor elements are mounted on plated circuits as performed about a suspension substrate of a hard disc driver, the breakdown of the elements on the basis of static electricity produces a bad effect on the yield thereof. This is caused on the matter that static electricity is given to the insulated layer which constitutes the substrate. In order to overcome this problem, the insulated layer is subjected to static elimination. As a method for the static elimination, suggested are, for example, a method of spraying an antistatic or electroconductive paint, which contains an antistatic or electroconductive substance, onto the insulated layer so as to form an antistatic layer, as described in JP-A-11-286082; or a method of using, in the insulated layer, a resin having a low surface resistance of about $10^6$ to $10^{12}\Omega$. However, according to the method of forming the antistatic layer in the spraying manner, there arises a problem that an excessive step is required, examples of which include the step of removing unnecessary portions of the antistatic layer or the step of protecting areas where no antistatic layer is necessary with a resist before the spraying, and removing the resist after the antistatic layer is formed, in order to prevent the antistatic layer from being formed on the areas where no antistatic layer is necessary. The spraying method also has a problem that the thickness of the antistatic layer is not easily controlled so as to become uneven. The method using the low surface resistance resin in the insulated protecting layer has a problem that the resin cannot attain an insulation level required for wiring having a high density and sufficient insulation reliability cannot be ensured at the present time, when a high wiring density is desired.

SUMMARY OF THE INVENTION

An object of the present invention is to solve the above-mentioned problems in the prior art, and provide a composition for forming a protecting film which can be developed with low-concentration alkali solution in water, is excellent in heat resistance, and is further suitable for being used on circuits on a printed wiring board, which is required to have a small dust-generating property. Another object of the present invention is to provide a dry film for forming a protecting film which can make an insulated protecting film which has electric insulation and makes it possible to prevent static electricity from being given onto a surface. Still another object of the present invention is to provide a composition for forming a wiring-protecting film which is not easily warped and can keep a sufficient abrasion resistance, and a dry film for forming a protecting film, using the composition.

The inventors made eager investigation to attain the above-mentioned objects. As a result, the present invention has been made.

A first aspect of the present invention is a composition for forming a wiring-protecting film, which comprises a polyimide precursor (A), a compound (B) having at least two photopolymerizable groups, and a photopolymerization initiator (C), wherein the polyimide precursor (A) is a polyimide precursor obtained from a diamine component comprising a diamine compound represented by the following general formula (3) or (2):

$$H_2N-(R_5O)_n-R_6-NH_2 \qquad (3)$$

(wherein $R_5$ and $R_6$ each independently represent an aliphatic hydrocarbon group having 1 to 6 carbon atoms, and n is a positive number of 1 to 30 as an average value)

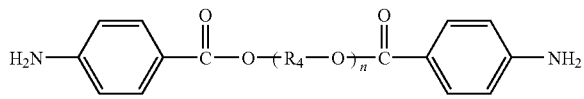

(2)

wherein $R_4$ represents a hydrocarbon group having 1 to 6 carbon atoms, and n represents a positive number of 1 to 30 as an average value.

The use of the polyimide precursor obtained from the diamine component, which comprises the diamine compound represented by the general formula (3) or (2), makes it possible to decrease stress that is generated when a protecting film is formed on a circuit substrate and that is applied to the substrate, and further results in such excellent effects that when the composition is made into a dry film, the photosensitive performance and the handling performance thereof are improved.

A second aspect of the present invention is a dry film for forming a wiring-protecting film, which is obtained from the above-mentioned composition.

A third aspect of the present invention is a dry film for forming a wiring-protecting film on a substrate, which is a dry film composed of two or more layers that are laminated and are each made of a photosensitive resin composition, wherein the photosensitive resin layer which contacts a wiring face is a resin layer obtained from the above-mentioned composition, and the photosensitive resin layer which is farthest from the wiring face is a resin layer having antistatic property or electroconductivity.

A fourth aspect of the present invention is a dry film for forming a wiring-protecting film on a substrate, which is a dry film composed of two or more layers that are laminated and are each made of a photosensitive resin composition, wherein the photosensitive resin layer which contacts a wiring face is a resin layer obtained from the above-mentioned composition for forming a wiring-protecting film, (the resin layer being referred to as the LER hereinafter), and the electric modulus of the resin layer after the layer is cured is lower than that of the photosensitive resin layer which is farthest from the wiring face (the resin layer being referred to as the HER hereinafter) after the layer is cured. In particular, a dry film obtained from the composition according to the first aspect of the present invention can be used suitably for forming a wiring-protecting film for a suspension substrate for hard discs.

A fifth aspect of the present invention is a substrate protected by means of on the above-mentioned dry film.

DETAILED DESCRIPTION OF THE PREFERRED EMBODIMENTS

In the composition for forming a wiring-protecting film of the present invention, the composition of the present invention preferably-comprises a polyimide precursor (A), a compound (B) having at least two photopolymerizable groups, and a photopolymerization initiator (C). More preferably, the compound (B) is a (meth)acrylate compound since the compound (B) has a high compatibility with the polyimide precursor (A) and a high curability when exposed to light, and the development thereof can easily be controlled. The amount of the compound (B) is preferably from 10 to 500 parts by weight, more preferably from 20 to 200 parts by weight for 100 parts by weight of the precursor (A). The amount of the photopolymerization initiator is preferably from 0.1 to 20%, more preferably from 1.0 to 14%, most preferably from 1.0 to 6% by weight as the total amount (based on solid contents) of the photopolymerization initiator and any photopolymerization coinitiator.

Examples of the polyimide precursor used in the present invention include a poly(amic acid), a poly(amic ester), and a poly(amide amic acid). To use the poly(amic acid) is industrially profitable and preferable. The poly(amic acid) is a polyimide precursor which is obtained by causing an acid anhydride such as pyromellitic dianhydride to react with a diamine compound such as 1,3-bis(4-aminophenoxy)benzene in a polar organic solvent such as N-methylpyrrolidone.

Examples of the acid anhydride as the starting material for synthesizing the polyimide precursor include pyromellitic dianhydride, 3,3',4,4'-benzophenonetetracarboxylic acid dianhydride, 1,2,5,6-naphthalenetetracarboxylic acid dianhydride, 2,3,6,7-naphthalenetetracarboxylic acid dianhydride, 1,4,5,8-naphthalenetetracarboxylic acid dianhydride, 1,1-bis(2,3-dicarboxylphenyl)ethane dianhydride, 2,2-bis(2,3-dicarboxylphenyl)ethane dianhydride, 2,2-bis(3,3-dicarboxylphenyl)ethane dianhydride, 2,2-bis[4-(3,4-dicarboxyphenoxy)phenyl]propane dianhydride, 3,3',4,4'-biphenyl ether tetracarboxylic acid dianhydride, 2,3,3',4'-biphenyl ether tetracarboxylic acid dianhydride, 2,3,5,6-pyridinetetracarboxylic acid dianhydride, pyromellitic dianhydride, 3,4,9,10-perylenetetracarboxylic acid dianhydride, 2,3,3',4'-benzophenonetetracarboxylic acid dianhydride, and 3,3',4,4'-benzophenonetetracarboxylic acid dianhydride. From the viewpoint of the compatibility of the polyimide precursor with other components, pyromellitic dianhydride and 3,3',4,4'-benzophenonetetracarboxylic acid dianhydride are preferable. However, preferable examples of the acid anhydride vary dependently on the composition of the constituent components.

Examples of the diamine compound for synthesizing the polyimide precursor used in the present invention include aromatic diamine compounds such as 3,3'-diaminodiphenyl ether, 4,4'-diamino-3,3',5,5'-tetramethyldiphenylmethane, 4,4'-diamino-3,3'-diethyl-5,5'-dimethyldiphenylmethane, 4,4'-diaminodiphenyl-2,2'-propane, 4,4'-diaminodiphenylmethane, 3,4'-diaminobenzanilide, 4,4'-diaminobenzanilide, 3,3'-diaminobenzophenone, 4,4'-diaminobenzophenone, 3,3'-diethyl-4,4'-diaminodiphenyl ether, 3,3'-diethoxy-4,4'-diaminodiphenylmethane, 3,3'-dimethyl-4,4'-diaminodiphenylmethane, 3,3'-dimethyl-4,4'-diaminodiphenylpropane, 3,3'-diethyl-4,4'-diaminodiphenylpropane, 3,3'-dimethyl-5,5'-diethyl-4,4'-diaminodiphenylmethane, 3,3'-dimethoxy-4,4'-diaminodiphenyl ether, 3,3'-dimethoxy-4,4'-diaminodiphenylmethane, 3,3'-dimethoxy-4,4'-diaminodiphenylsulfone, 3,3'-dimethoxy-4,4'-diaminodiphenylpropane, 3,3'-diethoxy-4,4'-diaminodiphenylpropane, 3,3',5,5'-tetramethyl-4,4'-diaminodiphenylmethane, 3,3',5,5'-tetraethyl-4,4'-diaminodiphenylmethane, 4,4'-bis(3-aminophenoxy)biphenyl, 4,4'-bis(4-aminophenoxy)biphenyl, 1,3-bis(3-aminophenoxy)benzene, 1,3-bis(4-aminophenoxy)benzene, 1,4-bis(4-aminophenoxy)benzene, 1,3-bis[3-(aminophenoxy)phenoxy]benzene, bis[4-(4-aminophenoxy)phenyl]ether, and 2,2'-bis[4-(4-aminophenoxy)phenyl]propane; 2,5(2,6)-bis(aminomethyl)bicycle[2.2.1]heptane; and a diamine compound represented by the following general formula (1):

(1)

wherein $R_1$ represents an organic group having 1 to 12 carbon atoms, or a single bond, and $R_2$ and $R_3$ each independently represent an organic group having 1 to 12 carbon atoms, and n represents a positive number of 1 to 30 as an average value.

Examples of the organic group having 1 to 12 carbon atoms in the formula (1) include bivalent organic groups such as ethylene, propylene, butylene, hexamethylene, phenylene, naphthylene, biphenylene, methylphenylene, hydroxyphenylene, aminophenylene, phenyleneoxyphenylene, benzoate, decamethylene, and dodecamethylene.

Preferable examples of the diamine include 3,3'-diaminodiphenyl ether, 1,3-bis(3-aminophenoxy)benzene, 1,3-bis(4-aminophenoxy)benzene, 1,3-bis[3-(aminophenoxy)phenoxy]benzene, 4,4'-bis(3-aminophenoxy)biphenyl, 2,5(2,6)-bis(aminomethyl)bicycle[2.2.1]heptane, and a diamine compound represented by the following general formula (3) or (2):

$$H_2N-(R_5O)_n-R_6-NH_2 \quad (3)$$

wherein $R_5$ and $R_6$ each independently represent an aliphatic hydrocarbon group having 1 to 6 carbon atoms, and n is a positive number of 1 to 30 as an average value, or

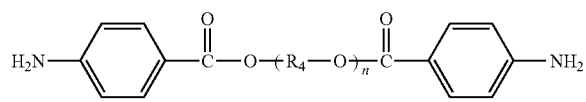

(2)

wherein $R_4$ represents a hydrocarbon having 1 to 6 carbon atoms, and n is a positive number of 1 to 30 as an average value.

Examples of the aliphatic hydrocarbon group having 1 to 6 carbon atoms in the formula (3) include ethylene, propylene, butylene, and hexamethylene.

Examples of the hydrocarbon having 1 to 6 carbon atoms in the formula (2) include ethylene, propylene, butylene and hexamethylene.

More preferable examples of the diamine compound include 1,3-bis(3-aminophenoxy)benzene, 1,3-bis(4-aminophenoxy)benzene, 1,3-bis[3-(aminophenoxy)phenoxy]benzene, 4,4'-bis(3-aminophenoxy)biphenyl, a diamine compound represented by the general formula (2) or (3) containing a polypropylene glycol chain, and a diamine compound represented by the general formula (2) or (3) containing a polyethyleneglycol chain.

In particular, to use, as starting material, a diamine compound containing an alkylene glycol chain or an ester bond is very useful for improving the flexibility of the film obtained from the composition and solving the problem of a warpage thereof but gives a drawback of lowering the heat resistance thereof. One or more out of these diamine compounds are usually used together with one or more different aromatic diamine compounds having heat resistance. About the ratio between the diamine compound(s) and the different diamine compound(s), the heat resistance is remarkably lowered in the case that the ratio by mole of the diamine compound(s), which contain(s) the alkylene glycol chain or the ester bond, to the different diamine compound(s) is 1.0 or more. Thus, the case may not be preferred. When the ratio by mole is 0.05 or more, the flexibility is markedly improved and a warpage is less generated. Therefore, the above-mentioned ratio by mole is preferably from 0.05 to 0.90.

The reaction temperature in the polymerization reaction between the diamine compound and the acid anhydride is usually from 10 to 60° C., preferably from 20 to 55° C. The pressure therein is not particularly limited. The reaction time depends on used organic solvent species and the reaction temperature. The time sufficient for completing the reaction is usually from 4 to 24 hours.

About the resultant poly(amic acid) solution, the viscosity thereof is preferably from 0.5 to 5.0 Pa·s, more preferably from 5.0 to 25.0 Pa·s. The viscosity referred to herein is a value obtained by measuring the solution with an EH type viscometer (manufactured by Toki Sangyo Co., Ltd.) using 3° cone at 25° C.

When the viscosity of this poly(amic acid) solution is 0.5 Pa·s or more, the coating film favorably gives a sufficient strength at exposed areas and a high resolution. When the viscosity is 50.0 Pa·s or less, the poly(amic acid) is favorably good in compatibility with the compound (B), which has photopolymerizable groups, and is superior in solubility in alkaline solution to give a high resolution. This viscosity can be adjusted at will by changing the ratio by mole between the diamine compound and the acid anhydride.

The poly(amic ester)s or the poly(amide amic acid) which can be used in the present invention is a polymer having the above-mentioned poly(amic acid) as a basic constituent, and is an esterified product of the carboxylic group in the molecule thereof or an amidated product thereof, respectively. For example, any poly(amic ester) is synthesized by causing an acid dianhydride such as pyromellitic anhydride to react with an alcohol compound, such as ethanol, which is beforehand dried, to synthesize a diesterified product; using oxazolyl chloride or the like to chlorinate the remaining carboxylic groups; and causing the resultant to be subjected to reaction with a diamine compound for removing hydrogen chloride. Any poly(amide amic acid)s also can be synthesized by a process similar to the synthesis process for the poly(amic ester)s.

The percentage of the polyimide precursor contained in the composition for forming a protecting film is from 10 to 95%, preferably from 30 to 70% by weight (on the basis of solid contents). When the percentage is 10% or more by weight, the solubility of the coating film exposed to light in alkaline solution is improved to give a high resolution and further the finally-cured film can express heat resistance, chemical resistance, electric insulation and other properties, which are good characteristics of polyimide. When the percentage is 95% or less by weight to keep the content by percentage of the compound (B), which has photopolymerizable groups, the composition of the present invention is capable of expressing photosensitivity, being cured by an energy ray such as UV, and forming a pattern by light.

Examples of the compound having at least two photopolymerizable groups, which is used in the present invention, include a (meth)acrylate compound having an alcoholic hydroxyl group and at least two unsaturated double bonds which can be photopolymerized (hereinafter referred to as the "(meth)acrylate compound $(B_1)$"), a di(meth)acrylate compound having a polyalkylene glycol chain (hereinafter referred to as the "(meth)acrylate compound $(B_2)$"), and other (meth)acrylate compounds. Examples of the (meth)acrylate compound $(B_1)$ include pentaerythritol triacrylate, pentaerythritol trimethacrylate, dipentaerythritol pentaacrylate, dipentaerythritol pentamethacrylate, tetramethylolpropane triacrylate, tetramethylolpropane trimethacrylate, tris{hydroxyethylacryloyl}isocyanurate, tris{hydroxyethylmethacryloyl}isocyanurate, isocyanuric acid triacrylate, and isocyanuric acid trimethacrylate. These may be used alone or in combination of two or more thereof. The (meth)acrylate compound $(B_1)$ is superior in compatibility with the polyimide precursor (A), and is used to control the curability of the composition when the composition is exposed to light and control the developability of the composition.

The content of the (meth)acrylate compound ($B_1$) is preferably from 0 to 200 parts by weight, more preferably from 5 to 200 parts by weight, even more preferably from 10 to 50 parts by weight for 100 parts by weight of the polyimide precursor (A). The setting of the content to 200 or less parts by weight favorably may make it possible that when the composition is exposed to light, the solubility thereof in alkaline solution is kept in unexposed areas, and further causes the flexibility of the cured polyimide product not to be damaged.

An example of the (meth)acrylate compound ($B_2$) is a compound represented by the following general formula (4):

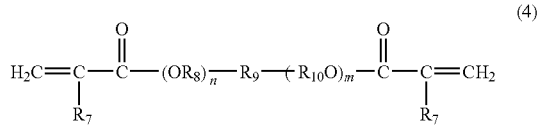

(4)

wherein $R_7$ represents a hydrogen atom or a methyl group; $R_8$ and $R_{10}$ each independently represent an aliphatic group having 2 to 5 carbon atoms; $R_9$ represents an aromatic group having two or more benzene rings, or a single bond; n and m each represent a positive number of 1 or more; and n+m is from 2 to 12.

The compounds represented by the formula (4) may be used alone or in combination of two or more.

The compound represented by the formula (4) is superior in compatibility with the polyimide precursor (A), and is used to control the curability of the composition when the composition is exposed to light and control the developability of the composition.

Preferable examples of the aliphatic group having 2 to 5 carbon atoms, as $R_8$ or $R_{10}$ in the formula (4), include ethylene, propylene, 1-butylene, and 2-butylene groups. The limitation of the number of the carbon atoms to 2-5 may make it possible that this compound keeps an appropriate water-solubility and expresses a good compatibility with the polyimide precursor (A).

Examples of the aromatic group having two or more benzene rings as $R_9$ in the formula (4) include residues of hydroxyl groups of compounds such as bisphenol A, bisphenol S, methylenebisphenol, 4,4'-ethylidenebisphenol, biphenol, 4,4'-oxybisphenol, 1,1'-biphenyl-4,4'-diol, 4,4'-cyclohexylilenebisphenol, 4,4'-(1-phenylethylidene)bisphenol, 4,4'-oxybisphenol, bis(4-hydroxyphenyl)methanone, 4,4'-(phenylmethylene)bisphenol; and an isocyanate residue of 4,4'-methylenebis(phenyl isocyanate). The setting of the number of the benzene rings to 2 or more may make it possible that the chemical resistance of the composition is improved while the hydrophilicity thereof is kept.

The content of the (meth)acrylate compound ($B_2$) is preferably from 10 to 500 parts by weight, more preferably from 20 to 200 parts by weight for 100 parts by weight of the polyimide precursor (A). When the content is 10 or more parts by weight, the compatibility of the compound ($B_2$) with the poly(amic acid)s may be improved and the resolution of the composition may be also made good. Simultaneously, the cured imide product has an improved flexibility and a high Tg and can further have a higher elongation ratio. When the content is 500 or less parts by weight, a cured film which makes use of good characteristics of polyimide can be obtained and the film can express chemical resistance and a high electric insulation.

If necessary, the following compound beside the above-mentioned compounds can be used in the present invention: a (meth)acrylate compound such as 1,6-hexadiol di(meth)acrylate, N,N'-methylenebis(meth)acrylate, neopentyl glycol di(meth)acrylate, pentaerythritol tetra(meth)acrylate, trimethylolpropane tri(meth)acrylate, 1,3,5-tri(meth)acryloylhexahydro-S-triazine, tris{hydroxyethyl(meth)acryloyl}isocyanurate, tri(meth)acrylformal, tetramethylolpropane tetra(meth)acrylate, tetramethylolmethane tetra(meth)acrylate, polyethylene glycol monomethacrylate, polyethylene glycol monomethacrylate, polyethylene glycol monoacrylate, polypropylene glycol monomethacrylate, polypropylene glycol monoacrylate, polyethylene glycol-polypropylene glycol monomethacrylate, polyethylene glycol-polypropylene glycol monoacrylate, lauroxypolyethylene glycol monomethacrylate, lauroxypolyethylene glycol monoacrylate, stearoxypolyethyleneglycol monomethacrylate, or nonylphenoxypolyethylene glycol monoacrylate. This (meth)acrylate compound can be used as far as this compound can be dissolved in the polyimide precursor (A). The (meth)acrylate compound can be usually used in an amount of 0 to 90 parts by weight for 100 parts by weight of the polyimide precursor (A).

Specific examples of the photopolymerization initiator (C) used in the present invention include benzophenone, Michler's ketones, benzoin, benzoin ethyl ether, benzoin butyl ether, benzoin isobutyl ether, 2,2-dimethoxy-2-phenylacetophenone, 2-hydroxy-2-phenylacetophenone, 2-hydroxy-2-methylpropiophenone, 2-hydroxy-4-isopropyl-2-methylpropiophenone, 2-ethylanthraquinone, 2-t-butylanthraquinone, diethylthioxanthone, chlorothioxanthone, benzyl, benzyldimethyl ketal, 1-hydroxycyclohexyl phenyl ketone, benzoylbenzoic acid, 2-methyl-1-(4-methylthiophenyl)-2-morpholinopropane-1-one, and 2,4,6-trimethylbenzoyldiphenylphosphine oxide. Other examples thereof include an equimolar adduct of benzoin and ethylene oxide, adducts of benzoin and twofold to fourfold molar ethylene oxide, an equimolar adduct of benzoin and propylene oxide, adducts of benzoin and twofold to fourfold molar propylene oxide, an equimolar adduct of α-allylbenzoin, 1-hydroxycyclohexyl phenyl ketone and ethylene oxide, adducts of α-allylbenzoin and 1-hydroxycyclohexyl phenyl ketone and twofold to fourfold molar ethylene oxide, an equimolar adduct of, 1-hydroxycyclohexyl phenyl ketone and propylene oxide, adducts of 1-hydroxycyclohexyl phenyl ketone and twofold to fourfold molar propylene oxide, an equimolar adduct of benzoylbenzoic acid and ethylene oxide, adducts of benzoylbenzoic acid and two fold to four fold molar ethyleneoxide, an equimolar adduct of benzoylbenzoic acid and propylene oxide, adducts of benzoylbenzoic acid and twofold to fourfold molar propylene oxide, an equimolar adduct of hydroxybenzophenone and ethylene oxide, adducts of hydroxybenzophenone and twofold to fourfold molar ethylene oxide, an equimolar adduct of hydroxybenzophenone and propylene oxide, adducts of hydroxybenzophenone and twofold to fourfold molar propylene oxide, 4-(2-hydroxyethoxy)-phenyl-(2-hydroxy-2-propyl) ketone, 4-(2-acryloxyethoxy)-phenyl-(2-hydroxy-2-propyl) ketone, an equimolar reactant of 4-(2-hydroxyethoxy)-phenyl-(2-hydroxy-2-propyl) ketone and ethylene oxide, adducts of 4-(2-hydroxyethoxy)-phenyl-(2-hydroxy-2-propyl) ketone and twofold to fourfold molar ethylene oxide, an equimolar reactant of 4-(2-hydroxyethoxy)-phenyl-(2-hydroxy-2-propyl) ketone and propylene oxide, adducts of 4-(2-hydroxyethoxy)-phenyl-(2-hydroxy-2-propyl) ketone and twofold to fourfold molar propylene oxide, 1-(4-isopropylphenyl)-2-hydroxy-2-methylpropane-1-one, and 1-(4-decylphenyl)-2-hydroxy-2-methylpropane-1-one. These may be used alone or in a mixture form of two or more thereof.

A photopolymerization coinitiator may be used together in order to improve the polymerization efficiency of the related components. Specific examples thereof include triethanolamine, diethanolamine, monoethanolamine, tripropanolamine, dipropanolamine, monopropanolamine, and isoamyl 4-dimethylaminobenzoate. These photopolymerization coinitiators may be used alone or in a mixture form of two or more thereof.

The content by percentage of each of the photopolymerization initiator and the photopolymerization coinitiator is preferably from 0.05 to 10%, more preferably from 0.5 to 7%, even more preferably from 0.5 to 3% by weight (on the basis of solid contents). When the total content by percentage of these components is 0.1% or more by weight, such a cure extent that a target resolution can be obtained may be obtained. When the total content is 20% or less by weight, the polymerization degree of the (meth)acrylate compound ($B_1$) can be appropriately adjusted to make it possible to control the resolution or flexibility.

If the fire resistance of the worked product obtained from the composition of the present invention is insufficient, a fire retardant may be beforehand added to this composition. The kind of the fire retardant to be used is not particularly limited. Usually, the fire retardant is preferably an organic or inorganic substance other than halogen-containing organic compounds and antimony compounds. Examples thereof include aluminum hydroxide, magnesium hydroxide, magnesium carbonate, calcium carbonate, graphite, heat-expandable graphite, melamine, phosphoric acid esters, phosphagen compounds, ammonium phosphate, and silicone compounds. However, the fire retardant is not limited thereto. Organic compounds containing a phosphorus atom have particularly high fire resistance. The incorporation of a small amount thereof may make it possible to exhibit the effect. Therefore, a sufficient fire resistance can be obtained without lowering original physical properties of the resin. Thus, the organic compounds are more preferable as the fire retardants. Specific examples of these compounds include triphenylphosphine oxide, triphenyl phosphate, tricresyl phosphate, trixylenyl phosphate, cresyldiphenyl phosphate, xylenyldiphenyl phosphate, cresylbis(di-2,6-xylenyl)phosphate, resorcinolbis (diphenyl) phosphate, bisphenol A bis(diphenyl)phosphate, bisphenol A bis(dicresyl)phosphate, resorcinolbis(di-2,6-xylenyl) phosphate, and compounds obtained by introducing a functional group reactive with the resin into these phosphorus-containing compounds. Of these compounds, bisphenol A bis(diphenyl) phosphate, bisphenol A bis(dicresyl)phosphate, resorcinolbis(di-2,6-xylenyl)phosphate are preferable fire retardants since they exhibit good compatibility.

The use amount of the fire retardant is preferably set to obtain a desired fire resistance without lowering original physical properties of the resin. Usually, the use amount is from 1 to 70 parts by weight, preferably from 1 to 50 parts by weight for 100 parts by weight of the photosensitive resin composition (the whole of the components (A), (B) and (C)).

For the composition, for forming a protecting film, of the present invention, a solvent is usually used. It is preferable to use, as the solvent, a solvent wherein a part or the whole of the components (A) to (C) can be dissolved. A poor solvent may be used as far as physical properties of the resin are not damaged from the workability (such as drying property) thereof. The use amount of the solvent is not particularly limited if physical properties of the resin are not damaged. The use amount is preferably from 30 to 90%, more preferably from 45 to 70% by weight of the composition of the present invention. In the case that the solvent is used within this range, at the time of forming a dry film the leveling property thereof may be improved so that the quality thereof is improved.

Examples of the solvent include ketones such as acetone, methyl ethyl ketone, methyl isobutyl ketone, cyclohexanone, cyclopentanone, methyl-n-amyl ketone, acetonylacetone, isophorone, and acetophenone; alcohols such as ethyl alcohol, isopropyl alcohol, n-butanol, ethylene glycol, diethylene glycol, triethylene glycol, propylene glycol, and hexylene glycol; ethers such as 1,4-dioxane, trioxane, diethylacetal, 1,2-dioxolane, diethylene glycol dimethyl ether and tetrahydrofuran; esters such as ethyl acetate, methyl benzoate, ethylene glycol monomethyl ether acetate, ethylene glycol monoethyl acetate, ethylene glycol monopropyl acetate, ethylene glycol diacetate, propylene glycol monomethyl ether acetate, propylene glycol monoethyl ether acetate, propylene glycol monopropyl ether acetate, propylene glycol monobutyl ether acetate, propylene glycol diacetate, diethylene glycol monomethyl ether acetate, diethylene glycol monoethyl ether acetate, diethylene glycol monoethyl ether acetate and diethyleneglycol diacetate; and hydrocarbons such as n-heptane, n-octane, cyclohexane, benzene, toluene, xylene, ethylbenzene, and diethylbenzene; aprotonic polar solvents such as dimethylsulfoxide, N,N-dimethylacetoamide, N,N-dimethylformamide, hexamethylphosphoramide, and N,N'-dimethylimidazolidinone. Any other solvent may be used as far as the attainment of the objects of the present invention is not hindered. These solvents may be used alone or in combination of two or more thereof. For example, a low boiling point solvent is mixed with a high boiling point solvent, whereby the generation of air bubbles can be suppressed when the composition is dried. Thus, the quality of the dry film can be improved.

The dry film of the present invention can be produced by applying the composition, for forming a protecting film, the solid content of which is adjusted to 30 to 90% by weight, onto a transparent and colorless film in a known coating manner using a reverse roll coater, gravure roll coater, comma coater, curtain coater or some other coater. Drying of the resultant coating film is preferably performed by means of a drying machine using hot wind, far infrared rays or near infrared rays at a temperature of 50 to 120° C., preferably 60 to 100° C. for 10 to 60 minutes.

The film thickness of the dry film is preferably from 5 to 100 µm, more preferably from 10 to 50 µm. When the film thickness is 5 µm or more, no problem is brought into the insulation reliability of the film. When the film thickness is 100 µm or less, the resolution can be improved.

The following is a preferable embodiment: the dry film is composed of two or more layers that are each made of a photosensitive resin composition, wherein the photosensitive resin layer which contacts a wiring face is a resin layer obtained from the composition of the present invention, and the photosensitive resin layer which is farthest from the wiring face is a resin layer having antistatic property or electroconductivity. This is because it is possible to prevent the phenomenon that static electricity given to the dry film breaks elements when the elements are mounted. When the above-mentioned coating manner is repeatedly used, a multilayered photosensitive resin layer can be formed.

It is preferable that the film thickness of the resin layer having antistatic property or electroconductivity is as small as possible. Specifically, the film thickness is preferably 5 µm or less.

The photosensitive resin having antistatic property or electroconductivity, which is used in the present invention, is a resin that has photosensitivity, which has a performance of giving a measure of difference in dissolution rate in a low-concentration alkali solution in water between light-exposed portions thereof and light-unexposed portions thereof, and that has electroconductivity or antistatic property. The photosensitivity of any material is a performance that the state of the material is changed by action of an active light ray. Examples of the active light ray include an electron beam, an ultraviolet ray, and an X-ray. The active light ray is preferably an ultraviolet ray. The electroconductivity or antistatic property of any material is generally a performance that the surface resistance of the material is somewhat low, and means specifically a surface resistance of $10^9 \Omega$ or less. In order to obtain such a photosensitive resin, an electroconductive material or antistatic agent may be incorporated into the compound (B), which has at least two photopolymerizable groups. The kind of the electroconductive material or antistatic agent is not particularly limited. Examples thereof include transparent electroconductive polymers such as polyethylene dioxythiophene/polysulfonic acid (PEDOT/PSS) [ORGACON (trade mark), manufactured by Nihon Siber Hegner K.K.], and UV curable antistatic agents [SUNRAD RC-501, 600, 611, 612, 700 and 750, UXC-201, and PLESTAT 300, NC6321, and NC7530, manufactured by Sanyo Chemical Industries, Ltd.]. An example of the electroconductive material is carbon black. It is advisable that the amount of the electroconductive material or antistatic agent which is to be added to the photosensitive resin is adjusted in such a manner that the insulation resistance of the resin will be $10^9 \Omega$ or less after the material or agent is added to the resin and the resin is worked. The amount is preferably from 0.1 to 20% by weight of the photosensitive resin from the viewpoint of physical properties of the resin.

It is preferable that the dry film is composed of two or more layers that are each made of a photosensitive resin composition, wherein the elastic modulus of the photosensitive resin layer (HER) which is farthest from a wiring face is made higher than that of the photosensitive resin layer (LER) which contacts the wiring face after the layers are cured. This is because the resistance of the film against permanent deformation based on external pressure can be improved. Specifically, the elastic modulus of the HER after the HER is cured is preferably from 0.1 to 5.0 GPa, more preferably from 1.0 to 4.0 GPa. When the elastic modulus is set to 0.1 GPa or more, abrasion resistance may be expressed. When the elastic modulus is set to 5.0 GPa or less, a surface which does not generate dust easily can be obtained. The elastic modulus ratio between the LER and the HER after they are cured preferably satisfies: the elastic modulus of the LER/the elastic modulus of the HER$\leq$0.5. When the elastic modulus ratio satisfies this inequality, stress from the wiring-protecting material onto the substrate can be decreased while the hardness of the surface layer of this material is maintained. Thus, a problem that the substrate warpages can also be overcome. Specifically, in order to obtain the LER and HER layers satisfying the above-mentioned inequality, the amount of the polyimide in the HER may be increased, the structure of the polyimide may be controlled, or a compound which exhibits a relatively high elastic modulus after the compound is cured may be used as the compound (B). In this way, the modulus can be adjusted into the range of 0.1 to 5.0 GPa.

The film thickness of the HER is preferably from 3 to 70%, more preferably from 5 to 20% of the total film thickness of the HER and the LER.

As the above-mentioned transparent and colorless film, the following can be used: a film made of a polyolefin such as low-density polyethylene, high-density polyethylene, polypropylene, ethylene/cyclodecene copolymer (trade name (trade mark): APEL, manufactured by Mitsui Chemicals, Inc.), or a polyester such as polyethylene terephthalate, polycarbonate, or polyarylate. Since physical properties of the poly(amic acid)s (A) are changed by water content, the raw material of the film is preferably a resin having a low moisture permeability. Of the above-mentioned resins, therefore, APEL (trade name), polyethylene terephthalate, polyethylene and polypropylene are preferable.

The thickness of the transparent and colorless film is usually from 15 to 100 μm, preferably from 30 to 75 μm. When the thickness is within this range, the film is excellent in applicability (or paintability), adhesiveness, rolling-up ability, toughness, economy, and others. Considering applicability (or paintability), adhesiveness, rolling-up ability, toughness, economy and others, more preferable is a film which is made of polyethylene, polypropylene or APEL (trade name) having a high ethylene content and which has a thickness of 15 to 100 μm, preferably 30 to 75 μm.

The dry film is overlapped on a suspension substrate surface on which circuits are formed. In a known manner such as plane lamination or roll lamination, the resultant is compressed at a pressure of 0.2 to 3 MPa while heated at 40 to 150° C., more preferably 40 to 120° C., even more preferably 60 to 100° C., thereby forming a photosensitive coating film. When the thermal compressable temperature is set to 40° C. or more, it may not happen that it takes much time on the basis of tacking to carryout positioning between the film and the substrate before the lamination. When the temperature is set to 150° C. or less, room maybe generated in the time for the lamination since the imidation does not advance very promptly. Thus, a process margin can widely be taken. The thermal compressable temperature means the temperature at which the film can be controlled to have such a viscosity that the resin can be sufficiently embedded in the circuit pattern without causing problems such as the remaining of air bubbles and simultaneously the resin does not flow excessively not to flow to the outside of the pattern.

The viscosity of the dry film at the lamination temperature thereof is preferably from 50 to 50000 Pa·s, more preferably from 100 to 5000 Pa·s. When the viscosity is set to 50 Pa·s or more, the flowing-out can be prevented at the time of the lamination. When the viscosity is set to 50000 Pa·s or less, good embeddability in the pattern can be obtained. The viscosity of the dry film at the lamination temperature thereof is measured, using a rheometer manufactured by HAAKE Co. to sandwich the film between parallel plates to set the thickness thereof into the range of 0.5 to 1.0 mm while applying shear stress having a frequency of 0.5 Hz thereto with a rise in the temperature of the film.

In order to make very small openings or very small width lines in the adhered dry film, the dry film is exposed to light through a photo mask. The exposure value, which is varied dependently on the composition of the material, is usually from 100 to 1000 mJ/cm$^2$. Examples of the active light ray used at this time include an electron beam, an ultraviolet ray, an X-ray. An ultraviolet ray is preferable. Examples of the light source which can be used include a low-pressure mercury lamp, a high-pressure mercury lamp, a super high pressure mercury lamp, and a halogen lamp.

After the exposure, a developing solution is used to conduct development in a immersing manner or a spraying manner. The developing solution which can be used is an aqueous alkaline solution such as aqueous sodium hydroxide solution, aqueous sodium carbonate solution, or aqueous tetramethylammonium hydroxide solution. After the development, the substrate with the film is usually washed with water. Before this water-washing, it may be allowable to conduct an operation for removing the alkaline components completely with diluted aqueous acid solution. The diluted aqueous acid solution may be an aqueous solution of sulfuric acid, hydrochloric acid, lactic acid, oxalic acid or some other acid. Thereafter, the substrate with the film is subjected to heating treatment, thereby converting the polyimide precursor to polyimide. The heating treatment is preferably conducted continuously or stepwise at 150 to 450° C., preferably at 200 to 300° C. for 0.1 to 5 hours.

The dry film of the present invention can be used suitably as a protecting film for a printed wiring board, in particular, a suspension substrate for hard discs.

EXAMPLES

The present invention is described in detail by way of the following typical examples. However, the present invention is not limited thereto.

Evaluations made in the examples and comparative examples were carried out by the following methods.

(1) Dielectric constant: an Al electrode having a diameter of 1 mm was attached, as a top electrode, to each protecting film, and then an impedance analyzer manufactured by Hewlett Packard Co. was used to measure the dielectric constant thereof at a frequency of 1 MHz.

(2) Solder heat resistance test: each protecting film was formed on copper foil, thereby producing a test piece, and then the test piece was floated on the liquid surface of molten solder, the temperature of which was kept at 260±5° C. It was then checked whether or not the film swelled.

(3) Dust-generating property: gas generated when each film was heated at 160° C. for 10 minutes was measured with a GC-MS (HP6890/HP5973, manufactured by Hewlett Packard Co.), and then the amount of the gas generated per unit area was checked.

(4) Migration resistance: a substrate with copper wiring (line width/space width=30 μm/30 μm), which was plated with gold, was used, and electric current (18 V DC) was sent thereto at 60° C. and 85% RH for 120 hours. It was then checked whether or not a short circuit was caused on the basis of insulation degradation.

(5) High-temperature exposure test: each film was exposed to a high temperature of 150° C. for 120 hours. Thereafter, a change in the external appearance thereof and a change in the dielectric constant thereof were checked.

(6) Warpage: each protecting film having a thickness of 38 μm was formed on a 2 mm×50 mm test piece of a substrate composed of a copper layer, a polyimide layer and a stainless steel layer, the thicknesses of which were 12 μm, 10 μm, and 20 μm, respectively. The heights of its both ends were measured. The total value of the heights was defined as warpage amount.

Example 1

A stirrer, a reflux condenser, a dropping funnel, and a nitrogen introducing tube were fitted to a 1-L separable flask, and then into the flask was charged 53.3 g of pyromellitic dianhydride (manufactured by Daicel Chemical Industries, Ltd.), and 246 g of N-methylpyrrolidone (manufactured by Wako Pure Chemicals, Industries) in nitrogen atmosphere. While the solution was stirred, the temperature of the inside was raised to 50° C. At this temperature, to the solution was dropwise added 21.7 g of JEFFAMINE D400 (manufactured by Sun Technochemicals Co., Ltd., a compound wherein $R_1$ is a single bond and $R_2$ and $R_3$ are each an isopropyl group in the general formula (1), the content of amino groups: 4.4 milliequivalent/g) little by little from the dropping funnel over 2 hours. After the end of the addition, the solution was continuously stirred for 1 hour at this temperature. Thereafter, the reaction temperature was lowered to 30° C. or lower. To the solution was added 57.2 g of 1,3-bis(3-aminophenoxy)benzene (manufactured by Mitsui Chemicals, Inc.), and then the solution was continuously stirred for 20 hours under nitrogen atmosphere, so as to yield a poly(amic acid) solution having a solid content of 35% by weight (amine mole ratio of the JEFFAMINE D400 to 1,3-bis(3-aminophenoxy)benzene=0.25).

To this solution were added 70.0 g of polyethylene glycol modified bisphenol A dimethacrylate (FA 321M, manufactured by Hitachi Chemical Co., Ltd.), 70 g of polyethylene glycol modified bisphenol A dimethacrylate (BPE 1300N, manufactured by Shin-Nakamura Chemical Co., Ltd.), 11.2 g of 2,4,6-trimethylbenzoyldiphenylphosphine oxide (SPEEDCURE TPO, manufactured by Nihon Siber Hegner K.K.) as a photopolymerization initiator, 2.8 g of diethylthioxanthone (KAYACURE-DETX, manufactured by Nippon Kayaku Co., Ltd.) as a photopolymerization initiator and 5.6 g of ethyl p-dimethylaminobenzoate (KAYACURE-EPA, manufactured by Nippon Kayaku Co., Ltd.) as a photopolymerization initiator, and 2.8 g of an antifoamer (BYK-057, manufactured by BYK Chemie Japan K.K.) at room temperature. The mixture was stirred for 5 hours to yield a brown viscous liquid. The viscosity of the liquid was 30 Pa·s.

The resultant solution was applied onto a carrier film (PET film) 30 cm wide and 19 μm long so as to have a thickness of about 80 μm. Thereafter, the resultant was dried in a hot-wind circulating drying machine at 100° C. for 10 minutes, and then a cover film (PET film) 38 μm thick was adhered thereto, so as to form a dry film. The cover film was peeled from the formed dry film. Pieces of the resultant film were overlapped onto a one-ounce rolled copper foil glossy surface, a stainless steel substrate for evaluating warpage, and a substrate for evaluating migration resistance. After the positioning thereof was carried out, a vacuum laminating device was used to compress them at 80° C. for 20 seconds, thereby adhering them onto each other. Thereafter, a high-pressure mercury lamp was used to expose the resultant test pieces to light at an exposure value of 600 mJ/cm$^2$. The exposed test pieces were developed with the spray of a 1.0% $Na_2CO_3$ solution in water at a temperature of 30° C. and a pressure of 0.15 Pa, washed with water, dried and then heated at 230° C. for 10 minutes, so as to be cured. Films having a thickness of 25 μm were obtained. The dielectric constant thereof was 3.4. No abnormalities were observed in the surfaces after the solder heat resistance test and the high-temperature exposure test. The dielectric constant after the high-temperature exposure test was 3.4, which was unchanged. No failure was observed within 120 hours in the migration resistance test. No external appearance abnormality was found out in the test piece after the test. The result of the dust-generating evaluation demonstrated that the amount of generated gas was a sufficiently low value of 8.9 μg/mm$^2$. The result of the warpage evaluation demonstrated that the average value of the warpage amounts was a sufficiently low value of 0.3 mm.

Example 2

A stirrer, a reflux condenser, a dropping funnel, and a nitrogen introducing tube were fitted to a 500-L separable flask, and then into the flask was charged with 28.8 g of 3,3',4,4'-biphenyltetracarboxylic acid dianhydride (manufactured by Mitsubishi Chemical Corp.) and 99.2 g of N,N-dimethylacetoamide (manufactured by Daicel Chemical Industries, Ltd.) in nitrogen atmosphere. While the solution was stirred, the temperature of the inside was raised to 50° C. At this temperature, to the solution was dropwise added 8.91 g of JEFFAMINE D400 (manufactured by Sun Technochemicals Co., Ltd., a compound wherein $R_1$ is a single bond and $R_2$ and $R_3$ are each an isopropyl group in the general formula (1), the content of amino groups: 4.4 milliequivalent/g) little by little from the dropping funnel over 1 hour. After the end of the addition, the solution was continuously stirred for 1 hour. Thereafter, the reaction temperature was lowered to 30° C. or lower. To the solution was then added 22.9 g of 1,3-bis(3-aminophenoxy)benzene (manufactured by Mitsui Chemicals, Inc.), and the solution was continuously stirred for 20 hours under nitrogen atmosphere, so as to yield a poly(amic acid) solution having a solid content of 38% by weight. To this solution were added 12.2 g of bismethacrylate (BLEMMER DP 403 AU, manufactured by NFO Corp.), which is a reaction product of polyethylene glycol (n=4.5) monomethacrylate and diphenylmethane diisocyanate (MDI), and 6.08 g of biimidazole (manufactured by Kurogane Kasei Co.) as a photopolymerization initiator at room temperature. The resultant solution was stirred for 5 hours to yield a brown viscous liquid. The solution of the liquid was 13 Pa·s.

From the resultant solution, a dry film was formed and evaluated in the same way as in Example 1. The thickness of the film was 25 μm, and the dielectric constant thereof was 4.0. No abnormalities were observed in the surfaces after the solder heat resistance test and the high-temperature exposure test. The dielectric constant after the high-temperature exposure test was 4.0, which was unchanged. No failure was observed within 120 hours in the migration resistance test. No external appearance abnormality of the test piece was found out after the test. The result of the dust-generating evaluation demonstrated that the amount of generated gas was a sufficiently low value of 1.2 μg/mm². The result of the warpage evaluation demonstrated that the average value of the warpage amounts was a sufficiently low value of 0.1 mm.

Example 3

A stirrer, a reflux condenser, a dropping funnel, and a nitrogen introducing tube were fitted to a 500-mL separable flask, and then 35.0 g of 1,3-bis(3-aminophenoxy)benzene (manufactured by Mitsui Chemicals, Inc.) and 25.1 g of an ELASMER 650P (manufactured by Ihara Chemical Industry Co., Ltd., polytetramethyleneoxide-di-p-aminobenzoate wherein $R_4$ is a tetramethylene group and n is 7 in the general formula (2)) were dissolved in 151.4 g of N,N-dimethylacetoamide (manufactured by Wako Pure Chemicals, Industries) in nitrogen atmosphere. To this solution was intermittently added 32.7 g of pyromellitic dianhydride (manufactured by Daicel Chemical Industries, Ltd.) so as to keep the reaction temperature at 25° C. or lower. Thereafter, the solution was continuously stirred under nitrogen atmosphere for 20 hours so as to yield a poly(amic acid) solution having a solid content of 38% by weight (amine mole ratio of the ELASMER 650P to 1,3-bis(3-aminophenoxy)benzene=0.25).

To this solution were added 45.0 g of polyethylene glycol modified bisphenol A dimethacrylate (FA 321M, manufactured by Hitachi Chemical Co., Ltd.), 45.0 g of polyethylene glycol modified bisphenol A dimethacrylate (BPE 1300N, manufactured by Shin-Nakamura Chemical Co., Ltd.), 7.2 g of benzyldimethyl ketal (ESACURE KB1, manufactured by Nihon Siber Hegner K.K.) as a photopolymerization initiator, 1.8 g of a mixture of trimethylbenzophenone and methylbenzophenone (ESACURE TZT, manufactured by Nihon Siber Hegner K.K.) as a photopolymerization initiator and 3.6 g of ethyl p-dimethylbenzoate (KAYACURE-EPA, manufactured by Nippon Kayaku Co., Ltd.) as a photopolymerization initiator, and 1.0 g of an antifoamer (BYK-0.57, manufactured by BYK Chemie Japan K.K.) at room temperature. The mixture was stirred for 5 hours to yield a brown viscous liquid. The viscosity of the liquid was 25 Pa·s.

From the resultant solution, a dry film was formed and evaluated in the same way as in Example 1. The thickness of the film was 25 μm, and the dielectric constant thereof was 3.4. No abnormalities were observed in the surfaces after the solder heat resistance test and the high-temperature exposure test. The dielectric constant after the high-temperature exposure test was 3.4, which was unchanged. No failure was observed within 120 hours in the migration resistance test. No external appearance abnormality of the test piece was found out after the test. The result of the dust-generating evaluation demonstrated that the amount of generated gas was a sufficiently low value of 5.4 μg/mm². The result of the warpage evaluation demonstrated that the average value of the warpage amounts was a sufficiently low value of 0.3 mm.

Example 4

A solution having a viscosity of 30 Pa·s was yielded in the same way as in Example 3 except that instead of the ELASMER 650P, the following was used: an ELASMER 1000P (manufactured by Ihara Chemical Industry Co., Ltd., polytetramethyleneoxide-di-p-aminobenzoate wherein $R_4$ is a tetramethylene group and n is 12 in the general formula (2). In the very same way as in Example 1, this solution was treated and the resultant film was evaluated. The thickness of the film was 25 μm, and the dielectric constant thereof was 3.8. No abnormalities were observed in the surfaces after the solder heat resistance test and the high-temperature exposure test. The dielectric constant after the high-temperature exposure test was 3.8, which was unchanged. No failure was observed within 120 hours in the migration resistance test. No external appearance abnormality of the test piece was found out after the test. The result of the dust-generating evaluation demonstrated that the amount of generated gas was a sufficiently low value of 9.2 μg/mm². The result of the warpage evaluation demonstrated that the average value of the warpage amounts was a sufficiently low value of 0.2 mm.

Example 5

A stirrer, a reflux condenser, a dropping funnel, and a nitrogen introducing tube were fitted to a 3-L separable flask, and then 175.1 g of 1,3-bis(3-aminophenoxy)benzene (manufactured by Mitsui Chemicals, Inc.) was dissolved in 500 g of N,N-dimethylacetoamide (manufactured by Tokyo Kasei Co., Ltd.) in nitrogen atmosphere. The temperature of the inside was raised to 50° C. To this solution was added 130.9 g of pyromellitic dianhydride (manufactured by Daicel Chemical Industries, Ltd.), in a dry solid form, little by little while the temperature of 50° C. was kept. After the addition, the solution was continuously stirred under nitrogen atmosphere for 20 hours so as to yield a polyimide precursor solution having a solid content of 38% by weight.

To this solution were added 135 g of polyethylene glycol modified bisphenol A dimethacrylate (FA 321M, manufactured by Hitachi Chemical Co., Ltd.), 94.5 g of polypropylene glycol modified bisphenol A dimethacrylate (FAP 328M, manufactured by Hitachi Chemical Co., Ltd.), 9.2 g of benzyldimethyl ketal (ESACURE KB1, manufactured by Nihon Siber Hegner K.K.) as a photopolymerization initiator, 2.3 g of 2,4-diethylthioxanthone (KAYACURE-DETX, manufactured by Nippon Kayaku Co., Ltd.) as a photopolymerization initiator and 4.6 g of ethyl p-dimethylaminobenzoate (KAYACURE-EPA, manufactured by Nippon Kayaku Co., Ltd.) as a photopolymerization initiator, and 60 g of bisphenol A bis (diphenyl)phosphate (CR-741, manufactured by Daihachi Chemical Industry Co., Ltd.) as a fire retardant at room temperature. The mixture was stirred for 5 hours to yield a brown viscous liquid. The viscosity of the liquid was 10 Pa·s.

In the very same way as in Example 1, this solution was treated and the resultant film was evaluated. The thickness of the film was 25 μm, and the dielectric constant thereof was 3.1. No abnormalities were observed in the surfaces after the solder heat resistance test and the high-temperature exposure test. The dielectric constant after the high-temperature exposure test was 3.1, which was unchanged. No failure was observed within 120 hours in the migration resistance test. No external appearance abnormality of the test piece was found out after the test. The result of the dust-generating evaluation demonstrated that the amount of generated gas was a sufficiently low value of 11.2 μg/mm$^2$. The result of the warpage evaluation demonstrated that the average value of the warpage amounts was a sufficiently low value of 0.2 mm.

Example 6

Preparation of a Photosensitive Resin Composition for Forming an LER

In a reactor equipped with a stirrer, a reflux condenser and a nitrogen introducing tube, 126.8 g (0.582 mol) of pyromellitic dianhydride was dissolved in 350 g of N,N-dimethylacetoamide and 350 g of diethylene glycol dimethyl ether, and the temperature of the solution was kept at 25 to 30° C. While this solution was stirred, thereto was dropwise added 26.3 g (0.059 mol) of polypropylene glycol diamine (trade name: JEFFAMINE D400 (manufactured by Sun Technochemicals Co., Ltd.) over about 60 minutes. Next, the temperature of the solution was raised to 50 to 55° C., and thereto was added 155.9 g (0.534 mol) of 1,3-bis(3-aminophenoxy)benzene, in a dry solid state, little by little. After the addition, the solution was continuously stirred under nitrogen atmosphere for 20 hours to yield a poly(amic acid) solution having a solid content of 30% by weight. Two hundred g of this solution were mixed with 60 g of an acrylate (trade name: BPE-500, manufactured by Shin-Nakamura Chemical Co., Ltd.), and then the following were mixed with the mixture: 2.5 g of a photopolymerization initiator (trade name: IRUGACURE 907, manufactured by Chiba Geigy Co.), which is referred to as the "IGC 907" hereinafter, and 1.5 g of a photopolymerization initiator (trade name: Speed Cure benzophenone, manufactured by Lambson Co.), which is referred to as the "BP" hereinafter. In this way, a photosensitive resin composition for forming an LER was yielded. The elastic modulus of a single layer obtained from this composition was 0.3 GPa after the composition was photo-cured.

(Preparation of a Photosensitive Resin Composition for Forming an HER)

In a reactor equipped with a stirrer, a reflux condenser and a nitrogen introducing tube, 73.2 g (0.593 mol) of 1,3-bis (aminophenoxy)benzene was dissolved in 350 g of N,N-dimethylacetamide and 350 g of diethylene glycol dimethyl ether. While this solution was stirred, thereto was dropwise added 126.8 g (0.582 mol) of pyromellitic dianhydride, in a dry solid state, little by little. During this, the reaction temperature was kept at 25 to 30° C. After the addition, the solution was continuously stirred under nitrogen atmosphere for 20 hours to yield a poly(amic acid) solution having a solid content of 30% by weight. Two hundred g of this solution were mixed with 30 g of pentaerythritol triacrylate (trade name: ARONIX M-305, manufactured by Toagosei Co., Ltd.) as an acrylate and 30 g of the BPE-500 as an acrylate, and then the following were mixed with the mixture: 2.5 g of the IGC 907 as a photopolymerization initiator, and 1.5 g of the BP as a photopolymerization initiator. In this way, a photosensitive resin composition for forming an HER was prepared. The elastic modulus of a single layer obtained from this composition was 1.2 GPa after the composition was photo-cured.

(Formation of a Bi-Layered Dry Film)

The prepared HER-forming photosensitive resin composition was applied onto a carrier film 30 cm wide and 20 μm thick, made of polypropylene, so as to have a thickness of 5 μm after the composition would be dried. Thereafter, the composition was dried in a hot-wind circulating drying machine at 80° C. for 10 minutes. Next, the LER-forming photosensitive resin composition was applied onto the dried film to have a thickness of 33 μm after the composition would be dried. Thereafter, the composition was dried in the hot-wind circulating drying machine at 80° C. for 20 minutes. A release film was adhered onto the dried film, so as to form a dry film having a total thickness of 38 μm.

(Protecting Film Evaluation)

The release film was peeled from the formed dry film, and the dry film was overlapped on a pattern-formed suspension substrate. Positioning between the film and the substrate was performed, and then the resultant was compressed at 80° C. for 20 seconds by means of a vacuum laminating device, exposed to light at 300 mJ/cm$^2$ through a mask, and developed with the spray of a 1.0% sodium carbonate solution in water at a temperature of 30° C. and a pressure of 0.15 MPa. According to observation results of the resultant after the development, a good resolution was shown about via holes having a diameter of 100 μm. Furthermore, the dry film was heated at 180° C. for 20 minutes and at 250° C. for 20 minutes. From the sample, test pieces having a shape 1 mm wide and 100 mm long were cut out. One end of each of the pieces was pressed, so that the other end was raised up. The height of the other end, which is referred to as the "warpage height" hereinafter, was measured. As a result, the warpage height was 0.1 mm. Thus, no large warpage was observed. The pencil hardness of the surface was measured according to JIS-K5400. As a result, the hardness was 4H, and was hardness sufficient for abrasion resistance.

Comparative Example 1

A dry film was formed in the same way as in Example 6 except that only the LER-forming photosensitive composition was applied and dried. The resultant dry film was treated and evaluated in the very same way as in Example 5. According to observation results of the resultant after the development, a good resolution was shown about via holes having a diameter of 100 μm. The warpage height was 0.1 mm. Thus, no large warpage was observed, but the pencil hardness of the surface was H, and was insufficient for abrasion resistance.

Comparative Example 2

A dry film was formed in the same way as in Example 6 except that only the HER-forming photosensitive resin composition was applied and dried. The resultant dry film was treated and evaluated in the very same way as in Example 5. According to observation results of the resultant after the development, a good resolution was shown about via holes having a diameter of 100 μm. The pencil hardness of the surface was 4H, and was hardness sufficient for abrasion resistance. However, the warpage height was a value over 30 mm to demonstrate that stress remained the substrate.

Comparative Example 3

A film was produced and evaluated in the very same way as in Example 6 except that the LER-forming photosensitive resin composition was used instead of the HER-forming photosensitive resin composition and further the HER-forming photosensitive resin composition was used instead of the LER-forming photosensitive resin composition. According to observation results of the resultant after the development, a good resolution was shown about via holes having a diameter of 100 μm. However, the pencil hardness of the surface was H, and was insufficient for abrasion resistance. The warpage height was a value over 30 mm to demonstrate that stress remained the substrate.

Example 7

Synthesis of Poly(Amic Acid)

In a reactor equipped with a stirrer, a reflux condenser and a nitrogen introducing tube, 230 g of 4,4'-bis(3-aminophenoxy)biphenyl was dissolved in 589 g of N-methylpyrrolidone in nitrogen atmosphere. While this solution was stirred, thereto was added 131 g of pyromellitic dianhydride, in a dry solid state, little by little. During this, the reaction temperature was kept at 25 to 30° C. After the addition, the solution was continuously stirred under nitrogen atmosphere for 20 hours to yield a poly(amic acid) solution having a solid content of 38% by weight.

(Preparation of a Vanish for Forming a Layer Having Antistatic Property or Electroconductivity)

Into 203 g of the resultant poly(amic acid) solution were incorporated and dissolved 45 g of the BPE-500, 2.5 g of the IGC 907, 1.5 g of the KAYACURE-DETX, and 10 g of an antistatic agent (RC-600, manufactured by Sanyo Chemical Industries, Ltd.), so as to yield a varnish A.

(Preparation of a Varnish for Forming a Layer Contacting Wiring)

The following were mixed with 187 g of the poly(amic acid) solution obtained in the above-mentioned way to yield a varnish B: 25 g of the BPE-500, 25 g of the M-305, 2.5 g of the IGC 907, and 1.5 g of the KAYACURE-DETX.

(Formation of a Dry Film)

The vanish A was applied onto a polyethylene terephthalate film G2 (manufactured by Teijin Du Pont Co.) as a carrier film with a gravure coater to have a thickness of 6 μm. This was dried at 80° C. for 4 minutes to yield a film on which a resin layer having a thickness 2 μm was formed. The vanish B was applied onto this resin layer with a comma coater to have a thickness of 50 μm. This was dried at 90° C. for 15 minutes to yield a film, the total thickness of its resin layers being 22 μm. A polyethylene film GF-1 (manufactured by Tamapoly Co., Ltd.) was adhered, as a protecting film, onto the film, so as to form a dry film.

(Protecting Film Evaluation)

The release film (polyethylene film GF-1) was peeled from the formed dry film, and the dry film was overlapped on a circuit board wherein a comb-shaped electrode (wiring width: 50 μm, width between wiring pieces: 50 μm, thickness: 9 μm) was formed. The resultant was compressed at 80° C. for 20 seconds by means of a vacuum laminating device, exposed to light at 600 mJ/cm$^2$, developed with the spray of a 1.0% sodium carbonate solution in water at a temperature of 30° C. and a pressure of 0.15 MPa, and washed with water. The dry film was heated at 180° C. for 20 minutes and at 250° C. for 20 minutes to yield a test piece. This test piece was allowed to stand still in a constant-temperature (about 23° C.) and constant-humidity (about 50% RH) room for 24 hours. Thereafter, a DC voltage (50 V) was applied to the comb-shaped electrode for 1 minute, so as to charge the electrode electrically. In this state, the insulation resistance value thereof was measured. As a result, the insulation resistance value of the inside insulation resin layer was a sufficient value of $10^{13}\Omega$ or more. The measurement result of the surface resistance of the test piece was a very low value of $10^6\Omega$, which demonstrated that antistatic performance was given to the test piece.

The dry film obtained from the composition, for forming a wiring-protecting film, of the present invention can be developed with a low-concentration alkali solution in water without using any organic solvent or high-concentration alkali solution in water, which brings a problem into a process for working a given article. The protecting film from this dry film has superior properties such that the film is excellent in long-term insulation reliability and heat resistance, is low in dust-generating property, and is unlikely to give a warpage to a substrate. The use of the dry film of the present invention which has two or more photosensitive resin layers make it possible to give antistatic property and high abrasion resistance easily to a protecting film surface.

What is claimed is:

1. The composition for forming a wiring-protecting film, which comprises a polyimide precursor (A), a compound (B) having at least two photopolymerizable groups, and a photopolymerization initiator (C), wherein the polyimide precursor (A) comprises a polyimide precursor obtained from a diamine component comprising a polyalkylene glycol diamine represented by the following general formula (2):

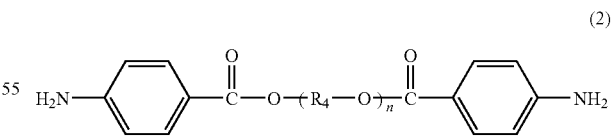

wherein $R_4$ represents a hydrocarbon group having 1 to 6 carbon atoms, and n represents a positive number of 1 to 30 as an average value.

2. A dry film for forming a wiring-protecting film, wherein the dry film is obtained from the composition according to claim 1.

3. A substrate on which a wiring-protecting film is made, wherein said wiring-protecting film comprises the dry film according to claim 2.

4. A dry film for forming a wiring-protecting film on a substrate, wherein the dry film comprises two or more layers that are laminated and are each made of a photosensitive resin composition, wherein the photosensitive resin layer that contacts a wiring face is a resin layer obtained from the composition according claim 1, and the photosensitive resin layer that is farthest from the wiring face is a resin layer having antistatic property or electroconductivity.

5. The dry film for forming a wiring-protecting film on a substrate according to claim 4, wherein a support made mainly of polyolefin or polyester is laminated on each of the uppermost face and lowermost face of the resin layers.

6. A substrate on which a wiring-protecting film is made, wherein said wiring-protecting film comprises the dry film according to claim 4.

7. A dry film for forming a wiring-protecting film on a substrate, wherein the dry film comprises two or more layers that are laminated and are each made of a photosensitive resin composition, wherein the photosensitive resin layer that contacts a wiring face is a resin layer obtained from the composition according to claim 1, and the elastic modulus of the resin layer after the layer is cured is lower than that of the photosensitive resin layer which is farthest from the wiring face after the layer is cured.

8. A substrate on which a wiring-protecting film is made, wherein said wiring-protecting film comprises the dry film according to claim 7.

9. The dry film for forming a wiring-protecting film on a substrate according to claim 7, wherein a support made mainly of polyolefin or polyester is laminated on each of the uppermost face and lowermost face of said resin layers.

10. A dry film for forming a wiring-protecting film on a substrate, wherein the dry film comprises two or more layers that are laminated and are each made of a photosensitive resin composition, wherein the photosensitive resin layer that contacts a wiring face is a resin layer obtained from a composition which comprises a polyimide precursor (A), a compound (B) having at least two photopolymerizable groups, and a photopolymerization initiator (C), wherein the polyimide precursor (A) comprises a polyimide precursor obtained from a diamine component comprising a diamine compound represented by the following general formula (3) and a different aromatic diamine compound having heat resistance:

$$H_2N\text{---}(R_5O)_n\text{---}R_6\text{---}NH_2 \quad (3)$$

(wherein $R_5$ and $R_6$ each independently represent an aliphatic hydrocarbon group having 1 to 6 carbon atoms, and n is a positive number of 1 to 30 as an average value) and wherein the ratio by mole of the diamine compound represented by general formula (3) to the different diamine compound is 0.05 to 0.90, and the photosensitive resin layer that is farthest from the wiring face is a resin layer having antistatic property or electroconductivity.

11. The dry film for forming a wiring-protecting film on a substrate according to claim 10, wherein a support made mainly of polyolefin or polyester is laminated on each of the uppermost face and lowermost face of the resin layers.

12. A substrate on which a wiring-protecting film is made, wherein said wiring-protecting film comprises the dry film according to claim 10.

13. A dry film for forming a wiring-protecting film on a substrate, wherein the dry film comprises two or more layers that are laminated and are each made of a photosensitive resin composition, wherein the photosensitive resin layer that contacts a wiring face is a resin layer obtained from a composition which comprises a polyimide precursor (A), a compound (B) having at least two photopolymerizable groups, and a photopolymerization initiator (C), wherein the polyimide precursor (A) comprises a polyimide precursor obtained from a diamine component comprising a diamine compound represented by the following general formula (3) and a different aromatic diamine compound having heat resistance:

$$H_2N\text{---}(R_5O)_n\text{---}R_6\text{---}NH_2 \quad (3)$$

(wherein $R_5$ and $R_6$ each independently represent an aliphatic hydrocarbon group having 1 to 6 carbon atoms, and n is a positive number of 1 to 30 as an average value) and wherein the ratio by mole of the diamine compound represented by general formula (3) to the different diamine compound is 0.05 to 0.90, and the elastic modulus of the resin layer after the layer is cured is lower than that of the photosensitive resin layer which is farthest from the wiring face after the layer is cured.

14. A substrate on which a wiring-protecting film is made, wherein said wiring-protecting film comprises the dry film according to claim 13.

15. The dry film for forming a wiring-protecting film on a substrate according to claim 13, wherein a support made mainly of polyolefin or polyester is laminated on each of the uppermost face and lowermost face of said resin layers.

* * * * *